(12) United States Patent
Tseng

(10) Patent No.: US 10,304,908 B2
(45) Date of Patent: May 28, 2019

(54) METHOD AND APPARATUS FOR IMAGE PROCESSING

(71) Applicant: BOE TECHNOLOGY GROUP CO., LTD., Beijing (CN)

(72) Inventor: Szuheng Tseng, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/521,593

(22) PCT Filed: Aug. 22, 2016

(86) PCT No.: PCT/CN2016/096190
§ 371 (c)(1),
(2) Date: Apr. 24, 2017

(87) PCT Pub. No.: WO2017/118040
PCT Pub. Date: Jul. 13, 2017

(65) Prior Publication Data
US 2018/0033838 A1 Feb. 1, 2018

(30) Foreign Application Priority Data

Jan. 4, 2016 (CN) .......................... 2016 1 0004752

(51) Int. Cl.
*G06T 7/90* (2017.01)
*H01L 27/32* (2006.01)
(Continued)

(52) U.S. Cl.
CPC ............ *H01L 27/3213* (2013.01); *G06T 7/90* (2017.01); *G09G 3/2003* (2013.01);
(Continued)

(58) Field of Classification Search
CPC ... H01L 27/3213; H01L 27/3218; G06T 7/90; G06T 2207/10024; G09G 3/2003;
(Continued)

(56) References Cited

U.S. PATENT DOCUMENTS

2007/0230818 A1* 10/2007 Messing .............. G09G 3/2003
382/275
2007/0279372 A1 12/2007 Brown Elliott et al.
(Continued)

FOREIGN PATENT DOCUMENTS

CN 101460988 A 6/2009
CN 101794565 A 8/2010
(Continued)

OTHER PUBLICATIONS

Office Action in Chinese Application No. 201610004752.4 dated Mar. 14, 2017, with English translation.
(Continued)

*Primary Examiner* — Yon J Couso
(74) *Attorney, Agent, or Firm* — Womble Bond Dickinson (US) LLP

(57) ABSTRACT

The present disclosure relates to a method and apparatus for image processing, comprising: transforming RGB luminance input values of each of pixels in an image into coordinate values in a uniform color space; moving the coordinates of each of pixels in the uniform color space a setting distance based on luminous efficiencies of RGBW and a replacement ratio of W; the setting distance being set so as to satisfy that a color difference between RGB luminance values transformed from the moved coordinate values in the uniform color space and the respective RGB luminance input values of each of pixels is less than a preset value, in order to maintain image quality; and the setting distance being set so as to satisfy that the minimum of the
(Continued)

transformed RGB luminance values is greater than the minimum of the RGB luminance input values. In this way, power consumption is reduced.

20 Claims, 2 Drawing Sheets

(51) Int. Cl.
G09G 3/20 (2006.01)
G09G 3/3233 (2016.01)
G09G 5/02 (2006.01)

(52) U.S. Cl.
CPC .............. *G09G 3/3233* (2013.01); *G09G 5/02* (2013.01); *G09G 5/026* (2013.01); *H01L 27/3218* (2013.01); *G09G 2300/0452* (2013.01); *G09G 2330/021* (2013.01); *G09G 2340/06* (2013.01)

(58) Field of Classification Search
CPC .................. G09G 3/3233; G09G 5/026; G09G 2320/0693; G09G 2340/06; G09G 2320/0238
See application file for complete search history.

(56) References Cited

U.S. PATENT DOCUMENTS

| | | | |
|---|---|---|---|
| 2008/0150863 A1 | 6/2008 | Morisue et al. | |
| 2009/0027410 A1* | 1/2009 | Inuzuka | G09G 5/026 345/555 |
| 2010/0013748 A1 | 1/2010 | Cok et al. | |
| 2011/0025703 A1* | 2/2011 | Edge | G09G 5/02 345/591 |
| 2011/0043553 A1* | 2/2011 | Brown Elliott | G09G 3/3406 345/694 |
| 2012/0212515 A1 | 8/2012 | Hamer et al. | |
| 2014/0218386 A1 | 8/2014 | Tatsuno et al. | |
| 2015/0138227 A1 | 5/2015 | Zhao et al. | |
| 2015/0154762 A1 | 6/2015 | Yang et al. | |
| 2016/0293082 A1 | 10/2016 | Zhang et al. | |

FOREIGN PATENT DOCUMENTS

| | | |
|---|---|---|
| CN | 101959072 A | 1/2011 |
| CN | 103218988 A | 7/2013 |
| CN | 103400566 A | 11/2013 |
| CN | 103634580 A | 3/2014 |
| CN | 103985372 A | 8/2014 |
| CN | 104091578 A | 10/2014 |
| CN | 105657391 A | 6/2016 |
| EP | 1569469 A1 | 8/2005 |

OTHER PUBLICATIONS

International Search Report and Written Opinion in PCT/CN2016/096190 dated Nov. 11, 2016, with English translation.

* cited by examiner

300

METHOD AND APPARATUS FOR IMAGE PROCESSING

RELATED APPLICATION

The present application is the U.S. national phase entry of PCT/CN2016/096190, with an international filling date of Aug. 22, 2016, which claims the benefit to Chinese Patent Application No. 201610004752.4, filed on Jan. 4, 2016, the entire disclosures of which are incorporated herein by reference.

FIELD

The present disclosure relates to the field of display technology, particularly to a method and apparatus for image processing.

BACKGROUND

At present, when an organic light-emitting diodes (OLEDs) device is employed to display images, in general, a way to reduce power consumption is to convert an original RGB (Red-Green-Blue) image into a RGBW (Red-Green-Blue-White) image for displaying. A specific way of image conversion is to replace a color with minimum luminance of the original RGB with a W pixel, and accordingly reduce luminance of other colors by the luminance value of the W pixel.

When RGBW conversions for pure colors (R/B/G/RG/RB/GB) are performed in a way as described above, since emission luminance of the color with minimum emission luminance of RGB is 0, power consumption would not be saved if the premise is that color saturation is not reduced. If color saturation is allowed to be reduced, the quality of displayed images may be degraded because of over-exploitation of W pixels.

Therefore, there is a conflict between maintaining image quality and saving power consumption when performing RGBW image conversion.

SUMMARY

In view of this, embodiments of the present disclosure provide a method and apparatus for image processing, for the purpose of solving the currently existing problems in RGBW conversion.

Therefore, a method provided in accordance with embodiments of the present disclosure comprises: transforming RGB luminance input values of each of pixels in an image into coordinate values in uniform color space; moving the coordinate values of each of pixels in the uniform color space a setting distance based on luminous efficiencies of RGBW and a replacement ratio of W, wherein the setting distance is set so as to satisfy that a color difference between RGB luminance values transformed from the moved coordinate values in the uniform color space and the RGB luminance input values of each of pixels is less than a preset value, and the minimum of the transformed RGB luminance values is greater than that of the RGB luminance input values; transforming the moved coordinate values of each of pixels in the uniform color space into RGB luminance values; and converting the transformed RGB luminance values into RGBW luminance output values based on the replacement ratio of W.

In some embodiments, in the above method for image processing provided in accordance with embodiments of the present disclosure, moving the coordinate values of each of pixels in the uniform color space the setting distance based on luminous efficiencies of RGBW and the replacement ratio of W comprises: moving the coordinate values of each of pixels in the uniform color space toward coordinate of white a same setting distance simultaneously when the replacement ratio of W equals to 1.

In some embodiments, in the above method for image processing provided in accordance with embodiments of the present disclosure, moving the coordinate values of pixels in the uniform color space the setting distance based on luminous efficiencies of RGBW and the replacement ratio of W comprises: moving the coordinate values of each of pixels in the uniform color space toward coordinate of a color with maximum luminous efficiency of RGBW a same setting distance simultaneously when the replacement ratio of W is less than 1.

In some embodiments, in the above method for image processing provided in accordance with embodiments of the present disclosure, before moving the coordinate values of each of pixels in the uniform color space the setting distance based on luminous efficiencies of RGBW and the replacement ratio of W, the method further comprises: determining the luminous efficiencies of RGBW, and determining coordinate of the color with maximum luminous efficiency in the uniform color space.

In some embodiments, in the above method for image processing provided in accordance with embodiments of the present disclosure, converting the transformed RGB luminance values into RGBW luminance output values based on the replacement ratio of W comprises: determining the minimum of the transformed RGB luminance values; determining the W luminance output value as a product of the minimum and the replacement ratio of W; and determining the RGB luminance output values as differences between the transformed RGB luminance values and the W luminance output value respectively.

An apparatus for image processing provided in accordance with embodiments of the present disclosure comprises: coordinate transformation unit, being arranged to transform RGB luminance input values of each of pixels in an image into coordinate values in a uniform color space; coordinate movement unit, being arranged to move the coordinate values of each of pixels in the uniform color space a setting distance based on luminous efficiencies of RGBW and a replacement ratio of W, the setting distance being set so as to satisfy that a color difference between the RGB luminance values transformed from the moved coordinate values in the uniform color space and the RGB luminance input values of each of pixels is less than a preset value, and the minimum of the transformed RGB luminance values is greater than that of the RGB luminance input values; coordinate inverse transformation unit, being arranged to transform the moved coordinate values of each of pixels in the uniform color space inversely into RGB luminance values; and RGBW conversion unit, being arranged to convert the transformed RGB luminance values into RGBW luminance output values based on the replacement ratio of W.

In some embodiments, in the above apparatus for image processing provided in accordance with embodiments of the present disclosure, the coordinate movement unit is arranged to move the coordinate values of each of pixels in the uniform color space toward coordinate of white a same setting distance simultaneously when the replacement ratio of W equals to 1.

In some embodiments, in the above apparatus for image processing provided in accordance with embodiments of the present disclosure, the coordinate movement unit is arranged to move the coordinate values of each of pixels in the uniform color space toward coordinate of a color with maximum luminous efficiency of RGBW a same setting distance simultaneously when the replacement ratio of W is less than 1.

In some embodiments, in the above apparatus for image processing provided in accordance with embodiments of the present disclosure, the coordinate movement unit is further arranged to determine the luminous efficiencies of RGBW, and to determine coordinate values of the color with maximum luminous efficiency in the uniform color space.

In some embodiments, in the above apparatus for image processing provided in accordance with embodiments of the present disclosure, the RGBW transformation unit is arranged to determine the minimum of the transformed RGB luminance values; determine the W luminance output value as a product of the minimum and the replacement ratio of W; determine the RGB luminance output values as differences between the RGB luminance values and the W luminance output value respectively.

In some embodiments, uniform color space can be a uniform color space for self-illumination, which comprises uv1 space.

A method and apparatus for image processing provided in accordance with embodiments of the present disclosure utilize a principle that human eyes perceive equal color differences when chromaticity changes are of equal distances in uniform color space. In the method and apparatus in accordance with embodiments of the present disclosure, RGB luminance input values of each of pixels in an image are firstly transformed into a uniform color space; coordinates of each of pixels in the uniform color space are moved a setting distance based on luminous efficiencies of RGBW and a replacement ratio of W; then the moved coordinate values are transformed inversely into RGB luminance values; and the transformed RGB luminance values are converted into RGBW luminance output values based on the replacement ratio of W. In accordance with embodiments of the present disclosure, since the setting distance is set so as to satisfy that a color difference between the RGB luminance values transformed from the moved coordinate values in the uniform color space and the RGB luminance input values is less than a preset value, image quality is maintained. Furthermore, since the setting distance is set so as to satisfy that the minimum of the transformed RGB luminance values is greater than that of the RGB luminance input values, the minimum luminance value of the transformed RGB luminance values is increased. In this way, when the transformed RGB luminance values are converted into RGBW luminance output values based on the replacement ratio of W, white can replace more components, thus achieving an effect of reducing power consumption.

BRIEF DESCRIPTION OF THE DRAWINGS

Now the above and other aspects of the present disclosure will be described in more detail with reference to the accompanying drawings of embodiments of the present disclosure.

DETAILED DESCRIPTION

The detailed description of a method and apparatus for image processing provided in accordance with embodiments of the present disclosure will be discussed in detail below in connection with the figures.

Figure 1:
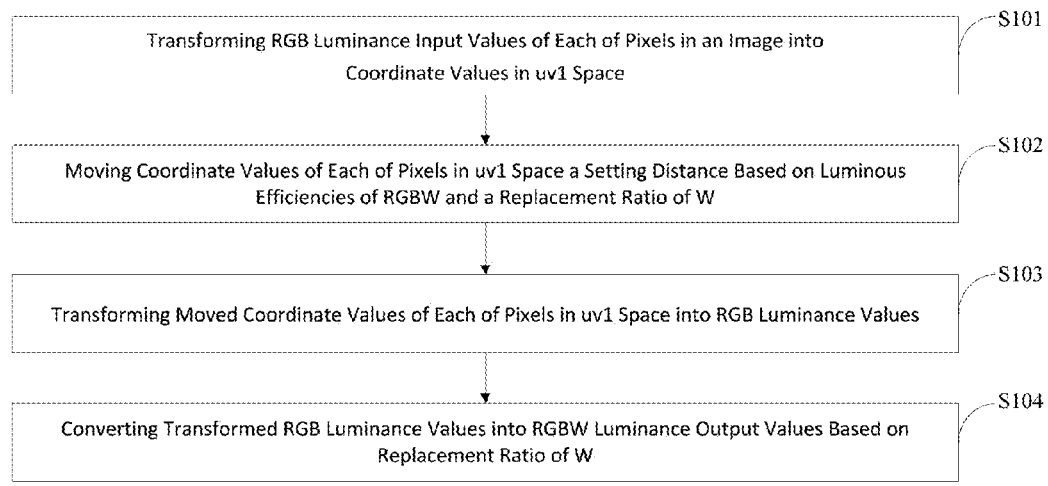
FIG. 1 is a flow chart of a method for image processing according to embodiments of the present disclosure.

FIG. 1 shows a method 100 for image processing provided in accordance with an embodiment of the present disclosure, in which uniform color space is particularly illustrated as uv1 space by way of example.

As shown in FIG. 1, the method 100 comprises steps of:

S101, RGB luminance input values of each of pixels in an image are transformed into coordinate values in uv1 space;

S102, the coordinate values of each of the pixels in uv1 space are moved a setting distance based on luminous efficiencies of RGBW and a replacement ratio of W. The setting distance is set so as to satisfy that a color difference between the transformed RGB luminance values of each of the pixels transformed from the moved coordinate values in uv1 space and the respective RGB luminance input values is less than a preset value, and the minimum of the transformed RGB luminance values is greater than that of the respective RGB luminance input values;

S103, the moved coordinate values of each of the pixels in uv1 space are transformed inversely into RGB luminance values;

S104, the transformed RGB luminance values are converted into RGBW luminance output values based on the replacement ratio of W.

The above method for image processing provided in accordance with embodiments of the present disclosure is based on a principle that human eyes perceive equal color differences when chromaticity changes are of equal distances in uniform color space. Since the method for image processing in accordance with embodiments of the present disclosure can satisfy that a color difference between RGB luminance values transformed from moved coordinate values in the uniform color space and respective RGB luminance input values is less than a preset value, image quality is maintained. Meanwhile, since it can be satisfied that the minimum of transformed RGB luminance values is greater than that of the respective RGB luminance input values, i.e. the minimum of the transformed RGB luminance values is relatively increased, white can replace more components when transformed RGB luminance values are converted into RGBW luminance output values, thus achieving an effect of reducing power consumption.

As used herein, color difference may refer to the difference between two colors that are perceived by human, which may be represented in numerical values. Uniform color space may refer to a color space in which an equal distance may express equal dimension of color difference in human visual perception.

As used herein, RGB luminance input values may be standard computer monitor RGB values; uv1 space refers to the color space specified by CIE in 1976 for self-illumination, which is called CIE LUV; luminous efficiencies of RGBW refers to the luminous efficiencies of respective red, green, blue and white sub-pixels; and replacement ratio of W refers to a replacement ratio of luminance in which white sub-pixels replaces RGB sub-pixels.

Figure 2A:
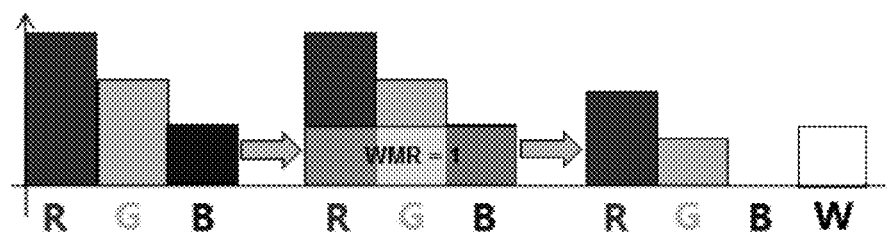
FIGS. 2a and 2b are schematic diagrams of RGBW conversion utilizing different replacement ratios of W in accordance with embodiments of the present disclosure respectively.
Figure 2B:
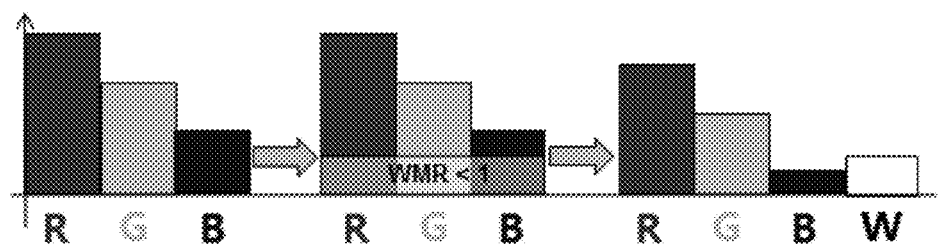

FIGS. 2a and 2b schematically show two different replacement ratios of W respectively.

FIG. 2a shows a replacement ratio of W of 1, that is, the case where WMR (White Mixing Ratio)=1. In FIG. 2a, the color in RGB with minimum emission luminance is illustrated as B (blue). Therefore, B is totally replaced with W pixel in RGBW image conversion. Assuming that $R_i$, $G_i$, $B_i$ are representative of input luminance values of an individual pixel of an input RGB image respectively, and $R_o$, $G_o$, $B_o$, $W_o$ are representative of output luminance values of an individual pixel of an output RBGW image respectively, then:

$$W_o=\min(R_i,G_i,B_i)=B_i, R_o=R_i-W_o, G_o=G_i-W_o, B_o=B_i-W_o.$$

FIG. 2b shows a case where the replacement ratio of W is less than 1, that is, WMR<1. In FIG. 2b, the color of RGB with minimum emission luminance is also illustrated as B (blue). Therefore, B is partially replaced with a W pixel in RGBW image conversion. Assuming that $R_i$, $G_i$, $B_i$ are respectively representative of input luminance values of an individual pixel of an input RGB image, and $R_o$, $G_o$, $B_o$, $W_o$ are respectively representative of output luminance values of an individual pixel of an output RBGW image, then:

$$W_o=\min(R_i,G_i,B_i)*WMR=B_i*WMR, R_o=R_i-W_o, G_o=G_i-W_o, B_o=B_i-W_o.$$

According to a specific implementation, in a method for image processing provided in accordance with embodiments of the present disclosure, the transformation step of transforming RGB luminance input values into uv1 space and the inverse transformation step of inversely transforming moved coordinates in uv1 space into RGB space can be taken by employing any suitable transformation formulas between RGB space and uv1 space.

According to a specific implementation, in a method for image processing provided in accordance with embodiments of the present disclosure, because there exists correspondences between distances in color space and perceived color differences in vision, a distance that coordinate values of individual pixels are moved in uv1 space may correspond to a respective color difference. In some embodiments, a preset value for a desired color difference can be determined e.g. in accordance with subjective visual perception on image quality based on experiences or experimentally, and the setting distance that coordinate values of individual pixels are moved in uv1 space may be set in accordance with the preset value of desired color differences. In an example, the setting distance is set to 0.02.

In some embodiments, coordinate values of individual pixels in uv1 space can be moved in different ways.

In an example, it is assumed that the replacement ratio of W equals to 1 (WMR=1). At this time, as shown in FIG. 2a, the minimum of RGB luminance values is totally replaced with W pixel. Therefore, in some embodiments, coordinate values of each of pixels in uv1 space can be moved toward coordinate of white a same setting distance. In this way, upon moving toward coordinate of white in uv1 space, RGB transformed from coordinate values in uv1 space all move toward W. Because a color with minimum emission luminance of RGB is totally replaced with W, amount of replacement of W will definitely increase compared with that before the coordinate values are moved, thus reducing power consumption.

In another example, it is assumed that the replacement ratio of W is less than 1 (WMR<1). In this case, as shown in FIG. 2b, the minimum of RGB luminance values is partially replaced with W. In this way, when moving toward coordinate of white in uv1 space, all of the transformed RGBs are moving toward W. Because the replacement ratio of W is unequal to 1, W cannot totally replace additional W in the RGBW conversion. When luminous efficiencies of RGB in RGBW are low, power consumption may not be reduced in this way. Therefore, in some embodiments, movement direction of coordinates may be arranged to be inversely proportional to luminous efficiencies of RGBW, e.g., moving in a direction with high luminous efficiency. To be more specific, the coordinate values of each of pixels in uv1 space can be moved toward coordinate of the color with maximum luminous efficiency of RGBW a same setting distance.

Further, when moving coordinate values of each of pixels in uv1 space toward coordinate of the color with maximum luminous efficiency of RGBW, the method can further comprise, before moving the coordinate values of each of pixels in uv1 space a setting distance based on the luminous efficiencies of RGBW and the replacement ratio of W, determining luminous efficiencies of respective color sub-pixels and determining coordinate values of the color with maximum luminous efficiency in uv1 space.

In some embodiments, conversion of transformed RGB luminance values into RGBW luminance output values may comprise:

determining the minimum of transformed RGB luminance values;

determining the W luminance output value as a product of the minimum and the replacement ratio of W; and determining the RGB luminance output values as differences between the transformed RGB luminance values and the W luminance output value respectively.

Table 1 shows simulation results for RGBW conversions of an image using a method for image processing provided in accordance with embodiments of the present disclosure and a method mentioned in the background of the disclosure respectively. In table 1, six images numbered as 1-6 are taken as examples, wherein 'a' is indicative of images processed with a traditional RGBW conversion approach, and 'b' is indicative of images resulting from RGBW conversion using a method for image processing in embodiments of the present disclosure. By way of example, the replacement ratios of W in the RGBW conversion as shown in Table 1 are selected as 0.6 and 1 respectively, that is, WMR=0.6 and WMR=1.

TABLE 1

| No. of Image | 1a | 1b | 2a | 2b | 3a | 3b | 4a | 4b | 5a | 5b | 6a | 6b |
|---|---|---|---|---|---|---|---|---|---|---|---|---|
| Amount of saved power consumption when WMR = 0.6 | 26% | 34% | 11% | 17% | 5% | 10% | 13% | 15% | 13% | 14% | 19% | 26% |

TABLE 1-continued

| No. of Image | 1a | 1b | 2a | 2b | 3a | 3b | 4a | 4b | 5a | 5b | 6a | 6b |
|---|---|---|---|---|---|---|---|---|---|---|---|---|
| Amount of saved power consumption when WMR = 1 | 44% | 55% | 18% | 29% | 9% | 16% | 21% | 29% | 21% | 31% | 32% | 43% |

It can be seen from table 1 that greater improvement in term of power consumption is achieved with a method provided in accordance with embodiments of the present disclosure than the existing RGBW conversion approach.

It will be understood that, though the above description is given in the context of uv1 space, the present disclosure is not limited thereto, but also can be applied to other uniform color spaces, e.g. a uniform color space for self-illumination.

An apparatus for image processing is also provided in accordance with the embodiments of the present disclosure. Since principles for the apparatus to solve problems are similar to that for the above image processing methods, the apparatus can be operated to implement steps of the corresponding methods.

Figure 3:
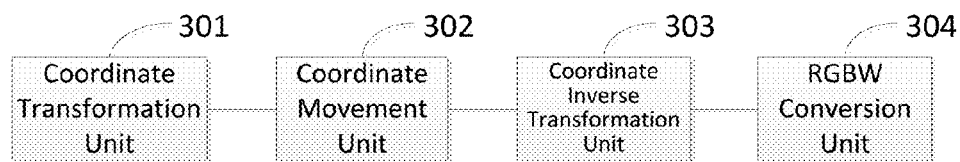
FIG. 3 is a structural schematic diagram of an apparatus for image processing in accordance with embodiments of the present disclosure.

FIG. 3 shows an apparatus 300 for image processing provided in accordance with the embodiments of the disclosure. The apparatus 300 comprises:

coordinate transformation unit 301, being arranged to transform RGB luminance input values of each of pixels in an image into coordinate values in uv1 space;

coordinate movement unit 302, being arranged to move the coordinate values of each of pixels in uv1 space a setting distance based on luminous efficiencies of RGBW and a replacement ratio of W, the setting distance being set so as to satisfy that a color difference between the RGB luminance values transformed from the moved coordinate values in uv1 space and the respective RGB luminance input values of each of pixels is less than a preset value, and the minimum of the transformed RGB luminance values is greater than that of the RGB luminance input values;

coordinate inverse transformation unit 303, being arranged to inversely transform the moved coordinate values of each of pixels in uv1 space into RGB luminance values; and RGBW conversion unit 304, being arranged to convert the transformed RGB luminance values into RGBW luminance output values based on the replacement ratio of W.

Further, in some embodiments, the coordinate movement unit 302 is arranged to move the coordinate values of each of pixels in uv1 space toward coordinate of white a same setting distance simultaneously when the replacement ratio of W equals to 1.

Further, in some embodiments, the coordinate movement unit 302 is arranged to move the coordinate values of each of pixels in uv1 space toward coordinate of a color with maximum luminous efficiency of RGBW a same setting distance simultaneously when the replacement ratio of W is less than 1.

Further, in some embodiments, the coordinate movement unit 302 is also arranged to determine luminous efficiencies of RGBW and determine coordinate values of the color with maximum luminous efficiency in uv1 space.

Further, in some embodiments, the RGBW conversion unit 304 is arranged to determine the minimum of the transformed RGB luminance values; determine the W luminance output value as a product of the minimum and the replacement ratio of W; determine the RGB luminance output values respectively as differences between the RGB luminance values and the W luminance output value.

Similarly, though the above description is given in the context of uv1 space, the present disclosure is not limited thereto and can also be applied to other uniform color spaces, for example a uniform color space for self-illumination.

Through the description of the above implementations, those skilled in the art can clearly understand that embodiments of the present disclosure can be implemented in hardware and with an approach of combining software and necessary general-purpose hardware platforms. Based on such understanding, the technical solutions in accordance with embodiments of the present disclosure can be embodied in the form of software products, which can be stored in non-volatile storage media (which may be CD-ROMs, USB flash disks, mobile hard disks and the like), including several instructions to cause a computer device (which may be personal computers, servers, or network devices and the like) to perform methods in accordance with the embodiments of the present disclosure.

Those skilled in the art would understand that the accompanying drawings are merely schematic diagrams of embodiments of the present disclosure, and modules or flows in the accompanying drawings are not necessarily required in implementation of the present disclosure.

Those skilled in the art would understand that modules of the apparatus in the above embodiments can be distributed in the apparatus in the embodiment in accordance with description of the embodiments, but also can be located in one or more apparatus different from those of the present embodiments. The modules in the above embodiments can be combined into one module, or can be further separated into multiple sub-modules.

The serial numbers of the embodiments of the present disclosure are merely for the purpose of description rather than representing superiority or inferiority of the embodiments.

In a method and apparatus for image processing in accordance with embodiments of the present disclosure, based on a principle that human eyes perceive equal color differences when chromaticity changes are of equal distances in uniform color space, RGB luminance input values of each of pixels in an image are firstly transformed into uniform color space; coordinate values of each of pixels in the uniform color space are moved a setting distance based on luminous efficiencies of RGBW and a replacement ratio of W; then the moved coordinate values are transformed into RGB luminance values, and the transformed RGB luminance values are transformed into RGBW luminance output values based on the replacement ratio of W. Since the setting distance is set so as to satisfy that a color difference between the RGB luminance values transformed from the moved coordinate values in the uniform color space and the RGB luminance input values of each of pixels is less than a preset value, image quality is maintained, and since the setting distance is set so as to satisfy that the minimum of the transformed RGB luminance values is greater than that of the RGB luminance input values, the minimum luminance of the transformed RGB luminance values is increased. In this way, when the transformed RGB luminance values are converted into RGBW luminance output values based on the replacement ratio of W, white can replace more components, thus achieving an effect of reducing power consumption.

It is obvious that those skilled in the art can make various modifications and variations to the present disclosure without departing from the spirit and scope of the present disclosure. The present disclosure includes all of those modifications and variations, and is only limited by the scope of the claims.

The invention claimed is:

1. A method for image processing in conversion of an RGB image into a RGBW image in a display device, comprising:
    transforming RGB luminance input values of each of pixels in the RGB image into coordinate values in a uniform color space;
    moving the coordinate values of each of pixels in the uniform color space a setting distance based on luminous efficiencies of RGBW and a replacement ratio of W, the setting distance being set so as to satisfy that a color difference between RGB luminance values of transformed from the moved coordinate values in the uniform color space and the RGB luminance input values of each of pixels is less than a preset value, and the minimum of the transformed RGB luminance values is greater than the minimum of the RGB luminance input values;
    transforming the moved coordinate values of each of pixels in the uniform color space inversely into RGB luminance values;
    converting the transformed RGB luminance values into RGBW luminance output values of respective pixels in the RGBW image to be displayed by the display device by replacing the color with the minimum of the transformed RGB luminance values with W based on the replacement ratio of W.

2. The method according to claim 1, wherein said moving the coordinate values of each of pixels in the uniform color space the setting distance based on luminous efficiencies of RGBW and the replacement ratio of W comprises:
    moving the coordinate values of each of pixels in the uniform color space toward coordinate of white a same setting distance simultaneously when the replacement ratio of W equals to 1.

3. The method according to claim 1, wherein said moving the coordinate values of each of pixels in the uniform color space the setting distance based on an luminous efficiencies of RGBW and the replacement ratio of W comprises:
    moving the coordinate values of each of pixels in the uniform color space toward coordinate of a color with maximum luminous efficiency of RGBW a same setting distance simultaneously when the replacement ratio of W is less than 1.

4. The method according to claim 3, further comprises, before moving the coordinate values of each of pixels in the uniform color space the setting distance based on luminous efficiencies of RGBW and the replacement ratio of W:
    determining the luminous efficiencies of RGBW, and determining coordinate values of the color with maximum luminous efficiency in the uniform color space.

5. The method according to claim 1, wherein said converting the transformed RGB luminance values into RGBW luminance output values based on the replacement ratio of W comprises:
    determining the minimum of the transformed RGB luminance values;
    determining the W luminance output value as a product of the minimum and the replacement ratio of W; and
    determining the RGB luminance output values as differences between the transformed RGB luminance values and the W luminance output value respectively.

6. The method according to claim 1, wherein the uniform color space is a uniform color space for self-illumination, which comprises uv1 space.

7. An apparatus for image processing in conversion of an RGB image into a RGBW image in a display device, comprising:
    coordinate transformation unit, being arranged to transform RGB luminance input values of each of pixels in the RGB image into coordinate values in a uniform color space;
    coordinate movement unit, being arranged to move the coordinate values of each of pixels in the uniform color space a setting distance based on luminous efficiencies of RGBW and a replacement ratio of W, the setting distance being set so as to satisfy that a color difference between the RGB luminance values transformed from the moved coordinate values in the uniform color space and the RGB luminance input values of each of pixels is less than a preset value, and the minimum of the transformed RGB luminance values is greater than the minimum of the RGB luminance input values;
    coordinate inverse transformation unit, being arranged to inversely transform the moved coordinate values of each of pixels in the uniform color space into RGB luminance values; and
    RGBW conversion unit, being arranged to convert the transformed RGB luminance values into RGBW luminance output values of respective pixels in the RGBW image to be displayed by the display device by replacing the color with the minimum of the transformed RGB luminance values with W based on the replacement ratio of W.

8. The apparatus according to claim 7, wherein the coordinate movement unit is arranged to move the coordinate values of each of pixels in the uniform color space toward coordinate of white a same setting distance simultaneously when the replacement ratio of W equals to 1.

9. The apparatus according to claim 7, wherein the coordinate movement unit is arranged to move the coordinate values of each of pixels in the uniform color space toward coordinate of a color with maximum luminous efficiency of RGBW a same setting distance simultaneously when the replacement ratio of W is less than 1.

10. The apparatus according to claim 9, wherein the coordinate movement unit is further arranged to determine the luminous efficiencies of RGBW, and to determine coordinate values of the color with maximum luminous efficiency in the uniform color space.

11. The apparatus according to claim 7, wherein the RGBW conversion unit is arranged to determine the minimum of the transformed RGB luminance values; determine the W luminance output value as a product of the minimum and the replacement ratio of W; and determine the RGB luminance output values as differences between the transformed RGB luminance values and the W luminance output value respectively.

12. The apparatus according to claim 7, wherein the uniform color space is a uniform color space for self-illumination, which comprises uv1 space.

13. A non-transitory computer storage medium, storing computer executable instructions thereon which, when executed by a computer device, cause the computer device to perform a method according to claim 1.

14. The non-transitory computer storage medium according to claim 13, wherein said moving the coordinate values of each of pixels in the uniform color space the setting distance based on luminous efficiencies of RGBW and the replacement ratio of W comprises:
   moving the coordinate values of each of pixels in the uniform color space toward coordinate of white a same setting distance simultaneously when the replacement ratio of W equals to 1.

15. The non-transitory computer storage medium according to claim 13, wherein said moving the coordinate values of each of pixels in the uniform color space the setting distance based on an luminous efficiencies of RGBW and the replacement ratio of W comprises:
   moving the coordinate values of each of pixels in the uniform color space toward coordinate of a color with maximum luminous efficiency of RGBW a same setting distance simultaneously when the replacement ratio of W is less than 1.

16. The non-transitory computer storage medium according to claim 15, wherein said computer executable instructions further comprise, before moving the coordinate values of each of pixels in the uniform color space the setting distance based on luminous efficiencies of RGBW and the replacement ratio of W:
   determining the luminous efficiencies of RGBW, and determining coordinate values of the color with maximum luminous efficiency in the uniform color space.

17. The non-transitory computer storage medium according to claim 13, wherein said converting the transformed RGB luminance values into RGBW luminance output values based on the replacement ratio of W comprises:
   determining the minimum of the transformed RGB luminance values;
   determining the W luminance output value as a product of the minimum and the replacement ratio of W; and
   determining the RGB luminance output values as differences between the transformed RGB luminance values and the W luminance output value respectively.

18. The non-transitory computer storage medium according to claim 13, wherein the uniform color space is a uniform color space for self-illumination, which comprises uv1 space.

19. A computer device, comprising:
   one or more processors; and
   non-transitory computer-readable storage media having thereon computer-executable instructions that, when executed by the one or more processors causes the computer device to perform a method according to claim 1.

20. The computer device according to claim 19, wherein said converting the transformed RGB luminance values into RGBW luminance output values based on the replacement ratio of W comprises:
   determining the minimum of the transformed RGB luminance values;
   determining the W luminance output value as a product of the minimum and the replacement ratio of W; and
   determining the RGB luminance output values as differences between the transformed RGB luminance values and the W luminance output value respectively.

* * * * *